SEMICONDUCTIVE DEVICES

Filed Aug. 30, 1955

INVENTORS
HERMANN STATZ
HANS SCHENKEL
BY Elmer J. Gorn
ATTORNEY

United States Patent Office 2,843,515

Patented July 15, 1958

2,843,515

SEMICONDUCTIVE DEVICES

Hermann Statz, Waltham, and Hans Schenkel, Cambridge, Mass., assignors to Raytheon Manufacturing Company, Waltham, Mass., a corporation of Delaware Application August 30, 1955, Serial No. 531,560

4 Claims. (Cl. 148—33)

Figure 1:
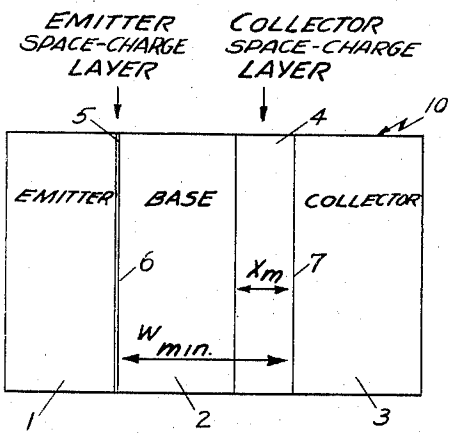

This invention relates generally to semiconductive devices, and more particularly to novel transistors of the junction type which have an emitter-current amplification factor, commonly denoted as $\alpha$, which may be equal to or greater than unity.

As is now well known in the art, the electrical characteristics of semiconductive materials, such as germanium and silicon, are largely determined by small traces of impurity material or slight mechanical defects which are present on the surface or within the bodies of the materials. The presence of impurity material alters the valence composition of the semiconductor, and consequently alters the electrical conductivity characteristics thereof to give rise to either N-type semiconductive material or P-type semiconductive material depending upon the nature of the impurity material present. A semiconducting material in which the impurity material causes conduction to be principally by "holes" or electron deficiencies is identified as P-type, whereas semiconducting material in which the impurity material causes conduction to be principally by electrons is identified as N-type.

Recent years have witnessed the development of a new class of electrical translation device utilizing both types of semiconductive material and comprising a body of the material having a plurality of conducting electrodes designated as emitter, collector, and base in contact therewith, and capable of controlling current flow through the semiconductor so as to enable the device to perform amplifying, rectifying, and in some cases oscillating functions. The devices are now known as transistors, and at present are of two distinct types, i. e., the point-contact type and the junction type. In the former, the emitter and collector may be point contacts bearing against the surface of the semiconductor body, and the base is a substantially ohmic connection to the body. In the junction type, the semiconductive body comprises a zone of one conductivity type material, either N or P, between and contiguous with two zones of opposite conductivity type material, a base connection to the intermediate zone, and emitter and collector connections to the outer zones, respectively.

Among the more important parameters of both the point-contact and the junction transistor is the quantity $\alpha$, designated as the emitter-current amplification factor and representing the ratio of the number of minority current carriers injected at the emitter to the number of such carriers which are collected at the collector. In circuitry, a current amplification factor greater than unity is very desirable, and even more desirable is an $\alpha$ which can be varied from values less than to values greater than unity. Heretofore, it has been thought impossible to provide junction transistors having an $\alpha$ factor of unity or greater, the value of $\alpha$ in presently known junction transistors ranging from 0.95 to 0.99. On the other hand, point-contact transistors are known in which the value of $\alpha$ is greater than unity, and can be varied to higher or lower values by varying the emitter current. As a result of this property, point-contact units have had a wide range of application in computer circuits, switching circuits etc., wherein the utilization of the junction type in such instances has been unfeasible. However, disadvantages inherent in all point-contact transistors, such as poor reproducibility, instability (drift of parameters with time), and low current ratings, have almost completely prevented the use of point-contact transistors in commercial circuits.

It is, therefore, the primary object of this invention to provide a junction type transistor in which the value of $\alpha$ may be unity or greater than unity. Applicants have found that this result may be accomplished by controlling the resistivity of the semiconductive material in the base region and the minimum width of the base region within critical limits directly related to the value of collector voltage used in operating the device.

Figure 2:
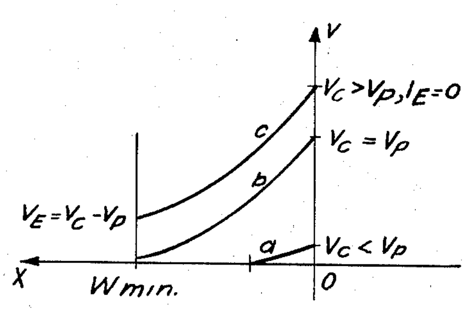
Figure 3:
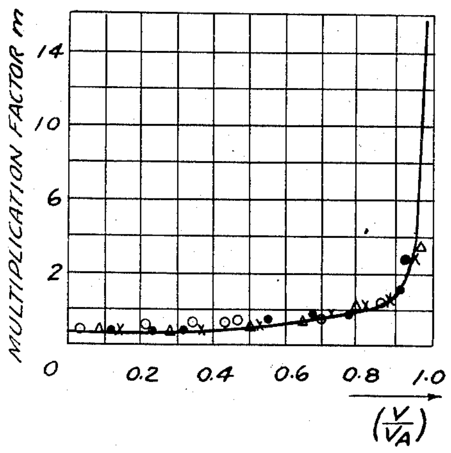
Figure 4:
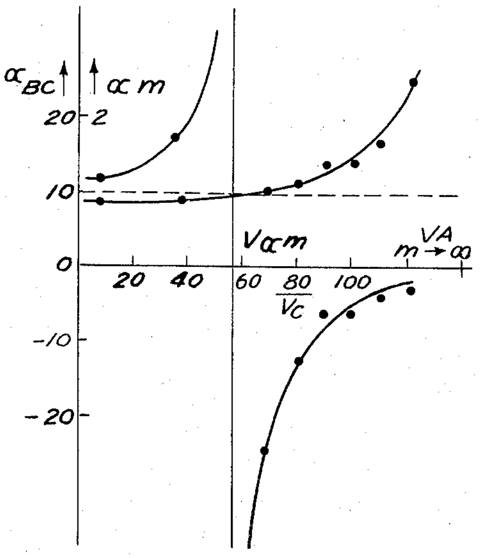

The invention will be better understood as the following description proceeds taken in conjunction with the accompanying drawing wherein:

Fig. 1 is a schematic representation of a junction transistor showing space charge layers; and Figs. 2, 3, and 4 are graphs useful in explaining the principles of the present invention.

In Fig. 1 there is shown a schematic cross-section of a junction transistor 10 comprising an emitter region 1, base region 2, and a collector region 3. In accordance with principles well known in the art, the emitter and collector regions may be composed of semiconducting material having one type electrical conductivity characteristic, such as P-type, while the base region 2 is composed of opposite conductivity type material, such as N-type. Although the foregoing describes what is known as a PNP junction transistor, it should be understood that transistor 10 may be of the NPN variety by appropriate interchange of the N and P type regions, and be equally susceptible to the principles of the present invention.

Existing at the collector and emitter junctions are space-charge layers 4 and 5, respectively. The space-charge region 4 at the collector junction is known to be voltage dependent, and the width $X_m$ thereof increases with increasing $V_c$, i. e., voltage applied to the collector. At a certain critical collector voltage, it has been found that the space-charge region has expanded throughout the base 2 and touches the emitter junction 6. This is called the punch-through effect, and the collector voltage at which it occurs is called the punch-through voltage $V_p$. This voltage thus represents an upper limit to transistor operation since at this voltage the emitter and collector are effectively short-circuited, and the current through the base can no longer be controlled by the base potential, that is, there is no transistor action.

The punch-through voltage is a function of the resistivity of the base material, and the minimum base width, and is given by the formula $$(1) \qquad V_p = \frac{1}{2\epsilon\rho\mu} W_{min}^2$$

where:

$\epsilon$ is the dielectric constant,
$\rho$ is the resistivity,
$\mu$ is the mobility of the conducting current carriers, and
$W_{min}$ is the base width between the emitter and collector junctions 6 and 7.

The potential V across the space charge layer is a function of X, the distance the space-charge layer has penetrated into the base region, is shown in Fig. 2. For curve (a) $V_c < V_p$; curve (b) $V_c = V_p$; and curve (c) $V_c > V_p$ with the emitter current $I_E = 0$. For $V_c > V_p$, a voltage appears at the emitter junction $V_E = V_c - V_p$, whereas for $V_c \leq V_p$, $V_E \approx 0$. Since the voltage across the space-charge region can be assumed equal to the applied collector voltage $V_c$, for either $V_c$ applied as $V_{cb}$ between collector and base, or applied as $V_{cE}$ between collector and emitter, the collector voltage at which punch-through occurs is the same in any possible transistor connections, that is, $V_p$ is the same for common base and common emitter connections. Furthermore, $V_p$ is the same for either the collector junction expanding toward the emitter, or emitter junction toward collector.

In addition to the punch-through effect, it has been found that a basically different phenomenon occurs as the value of the collector voltage increases to a second critical point. It is known that the saturation current in junction transistors, independent of voltage, increases rapidly when the junction voltage reaches a certain value. This phenomenon was formerly thought to be the Zener effect, i. e., the transition of electrons directly from the valence band to the conduction band under the influence of high electric fields. However, it has recently been discovered that the increase in current is not due to the Zener effect, but to an avalanche breakdown of the junction similar to the ionization in gaseous discharge tubes. The ionization rate increases with the electric field strength in the junction, and therefore with the junction voltage. This type of breakdown gives a multiplication of minority current carriers within the region of high electric field strength. The voltage at which the junction actually breaks down is called the avalanche breakdown voltage $V_A$. Fig. 3 shows the multiplication factor $m$, defined as the ratio of the actual junction current to the current that would flow if there were no ionization effects, plotted against the junction voltage V normalized to $V_A$. As can be readily seen, for low voltages, $m$ is close to unity, i. e., no appreciable multiplication effect is present. However, with increasing voltage, the multiplication factor increases until at $V=V_A$ a true breakdown, called avalanche breakdown, occurs, with the multiplication factor increasing to high values only in the vicinity of the avalanche breakdown voltage $V_A$.

Applicants have found that the avalanche voltage $V_A$ is dependent on the resistivity of the base material in alloyed junctions, and is substantially given by the formula $$V_A=80\rho^{0.6} \tag{2}$$

where $V_A$ is measured in volts, and $\rho$ in ohm-cm. As previously pointed out, the punch-through voltage $$V_p=\frac{1}{2\epsilon\rho\mu}W_{min}^2$$

Since for the operation of transistors, $V_p$ must be greater than the maximum operating collector voltage, the upper limit of which is $V_A$, (3) $W_{min}$ is substantially $\geqq\sqrt{V_A 2\epsilon\rho\mu}$. $W_{min}$ can thus be expressed as a function of $\rho$ from Equation 2. $\rho$ may be controlled by controlling the concentration of impurity material in the semiconducting material. In practice Equation 3 can easily be satisfied; for example, if $\rho=\frac{1}{4}$ ohm-cm., and $V_A=32$ volts, then $W_{min}\geqq 10^{-3}$ cm.

Since, in a transistor thus constructed, the current from the base arriving at the collector junction is multiplied by the factor $m$, the usual equation for collector current, viz., $$I_c=(I_s+I_l)+\alpha I_E \tag{4}$$

has to be modified to $$I_c=(mI_s+I_l)+(\alpha m)I_E=I_{co}+(\alpha m)I_E \tag{5}$$

where:

$I_c$=collector current,
$I_{co}$=collector cutoff current,
$I_E$=emitter current,
$I_l$=leakage current and
$I_s$=thermally generated saturation current.

The nature of the leakage current is not yet clear, but it can be said that it is a surface current and is not multiplied by $m$.

$I_c$ expressed in terms of the base current $I_b$ then becomes $$I_c=\frac{I_{co}+\alpha m I_B}{1-\alpha m} \tag{6}$$

The current amplifications are $$\frac{dI_c}{dI_E}=\alpha m \tag{7}$$

and $$\frac{dI_c}{dI_B}=\alpha_{Bc}=\frac{\alpha m}{1-\alpha m} \tag{8}$$

It is thus shown that with increasing $m$, the effective emitter to collector current amplification, $\alpha m$, can be equal to or greater than unity, and correspondingly, the base current amplification $\alpha_{Bc}$ will become infinite and negative as shown by the graph of Figure 4.

It can be seen, therefore, that there has been provided a junction type transistor, in which the current amplification factor may be equal to or greater than unity by controlling the resistivity and width of the base region within critical limits. Although there has been described what is considered to be a preferred embodiment of the present invention, various adaptations and modifications thereof may be made without departing from the spirit and scope of the appended claims.

What is claimed is:

1. A junction transistor comprising a body of semiconductive material selected from the group consisting of germanium and silicon, said body having an emitter region, a base region, and a collector region, the resistivity and width of the base region between said emitter and collector regions being of such value that a voltage applied to said collector will cause an avalanche breakdown at the collector junction before said voltage causes a space-charge existing at said collector to expand and touch said emitter region whereby said junction transistor may exhibit a current amplification factor of at least unity.

2. A junction transistor comprising a body of semiconductive material selected from the group consisting of germanium and silicon, said body having an emitter region, a base region, and a collector region, said base region having a width between said emitter and collector regions substantially in accordance with the formula $$W_{min}\geqq\sqrt{V_A 2\epsilon\rho\mu}$$

where:

$W_{min}$ is the minimum base width,
$V_A$ is the avalanche breakdown voltage,
$\epsilon$ is the dielectric constant,
$\rho$ is the resistivity, and
$\mu$ is the mobility of the conducting current carriers whereby said junction transistor may exhibit a current amplification factor of at least unity.

3. A junction transistor comprising a body of semiconductive material selected from the group consisting of germanium and silicon, said body having an emitter region, a base region, and a collector region, the resistivity and width of said base region between said emitter and collector regions being of such value that a voltage applied to said collector will cause a multiplication of the current carriers arriving at said collector before said voltage causes a space-charge existing at said collector to expand and touch said emitter region whereby said junction transistor may exhibit a current amplification factor of at least unity.

4. A junction transistor comprising a body of germanium, said body having an emitter region, a base region, and a collector region, said transistor having an avalanche breakdown voltage substantially in accordance with the formula $V_A=80\rho^{0.6}$ where $V_A$ is the avalanche breakdown voltage and $\rho$ is the resistivity of said base region whereby said junction transistor may exhibit a current amplification factor of at least unity.

References Cited in the file of this patent

UNITED STATES PATENTS

| | | |
|---|---|---|
| 2,623,102 | Shockley | Dec. 23, 1952 |
| 2,736,849 | Douglas | Feb. 28, 1956 |
| 2,744,970 | Shockley | May 8, 1956 |
| 2,767,358 | Early | Oct. 16, 1956 |

OTHER REFERENCES

Bell System Technical Journal, vol. 34, 1955, pages 883–902.

Proceedings of Physical Society of London, vol. 68B, 1955, pages 182–185.

Physical Review, Ser. 2, vol. 91, pages 1079–1084.